US012787702B2

(12) United States Patent
Kang et al.

(10) Patent No.: US 12,787,702 B2
(45) Date of Patent: Nov. 3, 2026

(54) SEMICONDUCTOR CHIP ALIGNMENT APPARATUS AND METHOD FOR PACKAGING

(71) Applicant: KOREA ATOMIC ENERGY RESEARCH INSTITUTE, Daejeon (KR)

(72) Inventors: Chang Goo Kang, Gwangju (KR); Jeong Min Park, Hwaseong-si (KR); Su Jin Kim, Seoul (KR)

(73) Assignee: KOREA ATOMIC ENERGY RESEARCH INSTITUTE, Daejeon (KR)

( * ) Notice: Subject to any disclaimer, the term of this patent is extended or adjusted under 35 U.S.C. 154(b) by 405 days.

(21) Appl. No.: 18/241,237

(22) Filed: Sep. 1, 2023

(65) Prior Publication Data

US 2024/0079258 A1 Mar. 7, 2024

(30) Foreign Application Priority Data

Sep. 5, 2022 (KR) ........................ 10-2022-0112390

(51) Int. Cl.
*H10P 72/50* (2026.01)
*H10W 80/00* (2026.01)

(52) U.S. Cl.
CPC ........... *H10P 72/53* (2026.01); *H10W 80/163* (2026.01)

(58) Field of Classification Search
CPC ... H10P 72/53; H10W 80/163; H10W 46/301; H10W 90/297
See application file for complete search history.

(56) References Cited

U.S. PATENT DOCUMENTS 7,299,545 B2 * 11/2007 Yamauchi .......... H05K 13/0015 29/721
7,918,953 B2 * 4/2011 Yamauchi .......... H05K 13/0015 156/64
9,748,128 B1 * 8/2017 Chao ...................... G01B 11/14
11,073,487 B2 * 7/2021 Bykanov .............. G01N 23/201
(Continued)

FOREIGN PATENT DOCUMENTS

CN 1659694 A * 8/2005 .............. H10P 72/53
CN 100394577 C * 6/2008 .............. H10P 72/53
(Continued)

OTHER PUBLICATIONS

Office Action dated Oct. 1, 2024 for corresponding Japanese Patent Application No. 2023-142942, along with an English translation (8 pages).

(Continued)

*Primary Examiner* — Laura M Menz
(74) *Attorney, Agent, or Firm* — Hauptman Ham, LLP

(57) ABSTRACT

Disclosed in the present document is an apparatus for aligning a semiconductor chip for packaging according to an embodiment, the apparatus may include a radiation source configured to irradiate a plurality of semiconductor chips with radiation; the plurality of semiconductor chips vertically disposed with respect to the ground; a radiation sensor configured to detect the radiation that has penetrated the plurality of semiconductor chips; and an alignment unit configured to align and bond the plurality of semiconductor chips based on detection information acquired by the radiation sensor.

8 Claims, 6 Drawing Sheets

(56) References Cited

U.S. PATENT DOCUMENTS

| | | | | |
|---|---|---|---|---|
| 11,815,349 | B2 * | 11/2023 | Peterson | G01B 15/045 |
| 12,306,382 | B2 * | 5/2025 | Nishimura | G02B 1/118 |
| 2005/0274869 | A1 * | 12/2005 | Yamauchi | H05K 13/0015 257/E23.179 |
| 2006/0110906 | A1 * | 5/2006 | Han | H10W 46/00 257/E21.705 |
| 2008/0073027 | A1 * | 3/2008 | Yamauchi | H05K 13/0015 257/E23.179 |
| 2009/0072414 | A1 * | 3/2009 | Tenmei | H10W 46/00 438/455 |
| 2009/0302486 | A1 * | 12/2009 | Terashima | H10W 46/00 438/758 |
| 2013/0082386 | A1 | 4/2013 | Meyer-Berg et al. | |
| 2016/0079102 | A1 * | 3/2016 | Fukayama | G01B 11/26 340/686.2 |
| 2018/0328868 | A1 * | 11/2018 | Bykanov | G01N 23/201 |
| 2019/0206652 | A1 * | 7/2019 | Akinwande | G01N 23/041 |
| 2021/0012499 | A1 * | 1/2021 | Adler | G01N 23/04 |
| 2021/0211595 | A1 * | 7/2021 | Yamamoto | G02B 13/0045 |
| 2021/0223512 | A1 * | 7/2021 | Nishimura | G02B 1/118 |
| 2021/0223517 | A1 * | 7/2021 | Yamamoto | G02B 1/118 |
| 2022/0042795 | A1 * | 2/2022 | Peterson | G01B 15/045 |
| 2022/0128487 | A1 | 4/2022 | Omote et al. | |
| 2024/0079258 | A1 * | 3/2024 | Kang | H10P 72/53 |
| 2025/0357416 | A1 * | 11/2025 | Kang | H10W 72/011 |

FOREIGN PATENT DOCUMENTS

| | | | | | |
|---|---|---|---|---|---|
| CN | 109155261 | A | | 1/2019 | |
| CN | 109643700 | A | * | 4/2019 | H10W 90/00 |
| CN | 110603437 | A | * | 12/2019 | H10P 72/0616 |
| CN | 120998850 | A | * | 11/2025 | H10W 99/00 |
| DE | 112019002889 | B4 | * | 5/2024 | H10F 39/8063 |
| DE | 112019002909 | B4 | * | 5/2024 | H10F 39/184 |
| EP | 4575389 | A1 | * | 6/2025 | H10P 74/203 |
| EP | 4654251 | A1 | * | 11/2025 | H10W 99/00 |
| JP | H3-175647 | A | | 7/1991 | |
| JP | H03175647 | A | * | 7/1991 | |
| JP | 2004-226126 | A | | 8/2004 | |
| JP | WO2003085723 | A1 | * | 8/2005 | H10P 72/53 |
| JP | 4033838 | B2 | * | 1/2008 | H10P 72/53 |
| JP | 2014-123656 | A | | 7/2014 | |
| JP | 2016-62958 | A | | 4/2016 | |
| JP | 2016062958 | A | * | 4/2016 | H10W 46/00 |
| JP | 2017183456 | A | * | 10/2017 | H10W 90/00 |
| JP | 6305887 | B2 | * | 4/2018 | H10W 46/00 |
| JP | 6613194 | B2 | * | 11/2019 | H10W 90/00 |
| JP | 2020520453 | A | * | 7/2020 | H10P 72/0616 |
| JP | 2022-69273 | A | | 5/2022 | |
| JP | 7135003 | B2 | * | 9/2022 | H10P 72/0616 |
| JP | 2022173222 | A | * | 11/2022 | H10P 72/0616 |
| JP | 7379620 | B2 | * | 11/2023 | H10P 72/0616 |
| JP | 2024036307 | A | * | 3/2024 | H10W 90/00 |
| JP | 7656670 | B2 | * | 4/2025 | H10W 90/00 |
| JP | 2025175962 | A | * | 12/2025 | H10W 99/00 |
| KR | 10-1998-053427 | A | | 9/1998 | |
| KR | 20040094900 | A | * | 11/2004 | H10P 72/53 |
| KR | 100567911 | B1 | * | 4/2006 | H10W 90/00 |
| KR | 10-2007-0052138 | A | | 5/2007 | |
| KR | 20100005150 | A | * | 1/2010 | H10P 72/53 |
| KR | 10-1014986 | B1 | | 2/2011 | |
| KR | 101065899 | B1 | * | 9/2011 | H10P 72/53 |
| KR | 101086097 | B1 | * | 11/2011 | H10P 72/53 |
| KR | 10-2013-0035799 | A | | 4/2013 | |
| KR | 101332775 | B1 | * | 11/2013 | H10P 72/0606 |
| KR | 20190141009 | A | * | 12/2019 | H10P 72/0616 |
| KR | 10-2134069 | B1 | | 7/2020 | |
| KR | 102515243 | B1 | * | 3/2023 | H10P 72/0616 |
| KR | 102575501 | B1 | * | 9/2023 | H10W 90/00 |
| KR | 20250165986 | A | * | 11/2025 | H01L 24/80 |
| TW | 201123364 | A1 | | 7/2011 | |
| TW | I397155 | B | * | 5/2013 | |
| TW | 202412121 | A | * | 3/2024 | H10W 90/00 |
| TW | I881453 | B | * | 4/2025 | H10W 90/00 |
| TW | 202546978 | A | * | 12/2025 | H10W 99/00 |
| WO | WO-03085723 | A1 | * | 10/2003 | H10P 72/53 |
| WO | WO-2018209134 | A1 | * | 11/2018 | G01N 23/207 |
| WO | WO-2025131543 | A1 | * | 6/2025 | H10P 74/203 |
| WO | WO-2025233063 | A1 | * | 11/2025 | H10W 46/00 |
| WO | WO-2025252363 | A1 | * | 12/2025 | H10W 72/072 |

OTHER PUBLICATIONS

Office Action dated Nov. 20, 2024 for corresponding Taiwanese Patent Application No. 112133675, along with an English translation (10 pages).

* cited by examiner

SEMICONDUCTOR CHIP ALIGNMENT APPARATUS AND METHOD FOR PACKAGING

CROSS REFERENCE TO RELATED APPLICATION

The present application claims priority to Korean Patent Application No. 10-2022-0112390, filed on Sep. 5, 2022, the entire contents of which is incorporated herein for all purposes by this reference.

BACKGROUND OF THE INVENTION

Field of the Invention

Embodiments disclosed in the present document relate to an apparatus and method for aligning a semiconductor chip for packaging.

Description of the Related Art

Research on the development of artificial intelligence modules has been continuing with the development of artificial intelligence technology. Accordingly, in addition to research on scaling of single chips through process refining, technology that can realize multifunctional chips by packaging chips with multiple functions is attracting attention in the field of artificial intelligence modules.

To this end, 2.5D/3D integration technologies using a silicon interposer, TSV, etc. have been developed, but until now, when semiconductor chips are bonded together (chip to chip bonding), a bonding position is identified and memorized using an optical method, and then bonded mechanically.

SUMMARY OF THE INVENTION

In general, when the alignment of semiconductor chips is performed for deposition or packaging in the semiconductor process, the optical method was relied upon first to align the semiconductor chips and then a bonding accuracy was dependent on the precision of the machine. That is, the semiconductor chips was aligned by optically identifying the positions of the semiconductor chips with a camera before being bonded together, and once aligned, no additional alignment was performed during the bonding process. Therefore, there was a problem in that an alignment error was caused by an error due to mechanical movement, which resulted in a lower yield. In particular, since even small errors can lead to failure in nanometer-scale processes, there was a need to improve the accuracy of the alignment.

According to an embodiment disclosed in the present document, there is provided an apparatus for aligning a semiconductor chip for packaging, the apparatus may include a radiation source configured to irradiate a plurality of semiconductor chips with radiation; the plurality of semiconductor chips vertically disposed with respect to the ground; a radiation sensor configured to detect the radiation that has penetrated the plurality of semiconductor chips; and an alignment unit configured to align and bond the plurality of semiconductor chips based on detection information acquired by the radiation sensor.

According to an embodiment disclosed in the present document, there is provided a method of aligning a semiconductor chip for packaging, the method may include: irradiating a plurality of semiconductor chips with radiation; detecting, by a radiation sensor, the radiation that has penetrated the plurality of semiconductor chips; and aligning and bonding the plurality of semiconductor chips based on detection information acquired by the radiation sensor.

An apparatus for aligning a semiconductor chip for packaging, according to embodiments disclosed in the present document, can continuously perform fine alignment of semiconductor chips by detecting a radiation source in the process of bonding a plurality of semiconductor chips, thereby increasing the accuracy of the bonding, and thereby increasing the production yield of the semiconductor.

An apparatus for aligning a semiconductor chip for packaging, according to embodiments disclosed in the present document, can increase packaging yields by improving the precision of alignment over conventional optical alignment-based bonding, thereby reducing production costs and improving price competitiveness.

An apparatus for aligning a semiconductor chip for packaging, according to embodiments disclosed in the present document, can prevent the semiconductor chip from being damaged by irradiating the semiconductor chip with low-dose radiation or penetrating radiation only to a portion of an area where an alignment mark and/or TSV is positioned, rather than to an entire area of the semiconductor chip.

In addition, various effects that can be directly or indirectly identified through the present document may be provided.

DETAILED DESCRIPTION OF THE INVENTION

Figure 1:
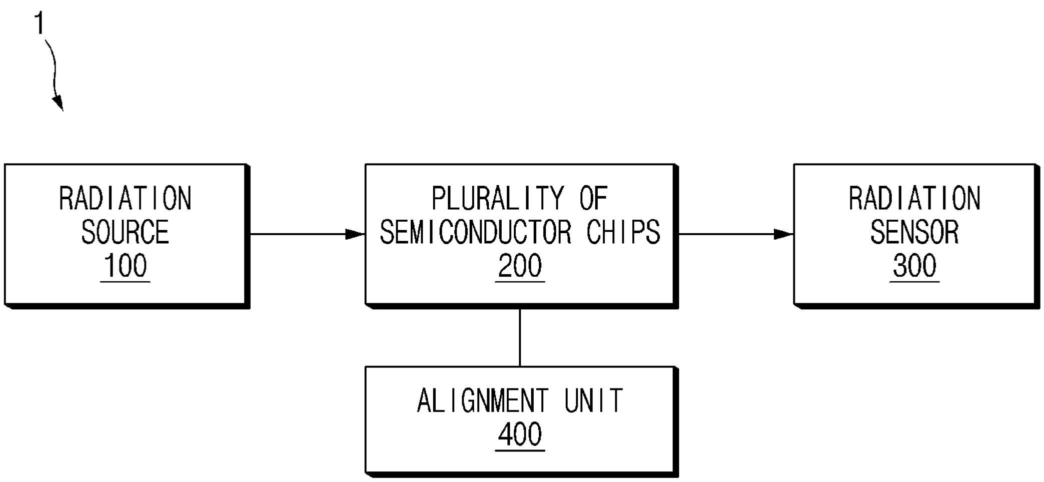
FIG. 1 is a block diagram of an apparatus for aligning a semiconductor chip for packaging, according to an embodiment disclosed in the present document.

Hereinafter, various embodiments of the present disclosure are described with reference to the accompanying drawings. However, this is not intended to limit the present disclosure to any particular embodiment and is should be understood to include various modifications, equivalents, and/or alternatives to the embodiments of the present disclosure.

In the present document, the singular form of a noun corresponding to an item may include one or more of the items, unless the relevant context clearly indicates otherwise. In the present document, each of the phrases “A or B,” “at least one of A and B,” “at least one of A or B,” “A, B or C,” “at least one of A, B and C,” and “at least one of A, B, or C” may include any of the items listed together in the corresponding phrase among those phrases, or any possible combination thereof. The terms such as “first”, “second”, or “first” or “second” may be used simply to distinguish a constituent element from other corresponding constituent elements and do not limit the constituent elements in any other respect (e.g., importance or order). In case that any (e.g., a first) constituent element is referred to as "coupled" or "connected" to another (e.g., a second) constituent element, with or without the terms "functionally" or "communicationally", it means that the constituent element may be connected to the other constituent element directly (e.g., wired), wirelessly, or through a third constituent element.

Each constituent element (e.g., module or program) of the constituent elements described in the present document may include a singular or plural number of objects. In various embodiments, one or more constituent elements of the corresponding constituent elements described above or operations may be omitted, or one or more other constituent elements or operations may be added. Alternatively or additionally, a plurality of constituent elements (e.g., modules or programs) may be integrated into a single constituent element. In this case, the integrated constituent element may perform one or more functions of the constituent element of each of the plurality of constituent elements in the same or similar manner as performed by the corresponding constituent element of the plurality of constituent elements prior to the integration. According to various embodiments, the operations performed by a module, program, or other constituent element may be executed sequentially, in parallel, iteratively, or heuristically, or one or more of the above operations may be executed in a different order, omitted, or one or more other operations may be added.

Each constituent element (e.g., module or program) of the constituent elements described in the present document may include a singular or plural number of objects. In various embodiments, one or more constituent elements of the corresponding constituent elements described above or operations may be omitted, or one or more other constituent elements or operations may be added. Alternatively or additionally, a plurality of constituent elements (e.g., modules or programs) may be integrated into a single constituent element. In this case, the integrated constituent element may perform one or more functions of the constituent element of each of the plurality of constituent elements in the same or similar manner as performed by the corresponding constituent element of the plurality of constituent elements prior to the integration. According to various embodiments, the operations performed by a module, program, or other constituent element may be executed sequentially, in parallel, iteratively, or heuristically, or one or more of the above operations may be executed in a different order, omitted, or one or more other operations may be added.

As used in the present document, the term "module" or "unit" may include a unit implemented in hardware, software, or firmware, and may be used interchangeably with terms such as logic, logic block, component, or circuit, for example. The module may be a component that is integrally constituted, or a minimum unit of the component, or a part thereof, that performs one or more functions. For example, according to an embodiment, the module may be implemented in the form of an application-specific integrated circuit (ASIC).

Various embodiments of the present document may be implemented as software (e.g., a program or application) comprising one or more instructions stored on a storage medium (e.g., memory) readable by a machine. For example, a processor of the device may invoke and execute at least one of the one or more instructions stored on the storage medium. This enables the machine to be operated to perform at least one function according to the at least one instruction called. One or more of the instructions that are described above may include code generated by a compiler or code that may be executed by an interpreter. The machine-readable storage medium may be provided in the form of a non-transitory storage medium. Here, "non-transitory" only means that the storage medium is a tangible device and does not include signals (e.g., electromagnetic waves), and this term does not distinguish between the case where the data is stored on the storage medium permanently and the case where the data is stored temporarily.

FIG. 1 is a block diagram of an apparatus for aligning a semiconductor chip for packaging, according to an embodiment disclosed in the present document.

Referring to FIG. 1, an apparatus 1 for aligning a semiconductor chip for packaging may include a radiation source 100, a plurality of semiconductor chips 200, a radiation sensor 300, and an alignment unit 400.

The apparatus 1 for aligning a semiconductor chip for packaging may perform a packaging process in a series of processes for producing a semiconductor, and the packaging process may be performed, for example, after a deposition process, an etching process, a photolithography process, and the like.

According to an embodiment, the radiation source 100 may irradiate a plurality of semiconductor chips 200 with radiation. The radiation source 100 may include a device or substance that emits radiation from the decay of a radioactive element, or an X-ray generating device that generates X-rays by colliding accelerated electrons with a target. The apparatus 1 for aligning a semiconductor chip for packaging may include a shielding body in a different direction other than a direction in which the plurality of semiconductor chips 200 are positioned to irradiate the plurality of semiconductor chips 200 with radiation emitted from the radiation source 100.

According to an embodiment, the radiation source 100 may be an X-ray source. The X-ray may have a wavelength of 10 nm to 0.01 nm, has little error caused by a thickness of the semiconductor chip, and penetrate the semiconductor chip, allowing the radiation sensor 300 to detect radiation that has penetrated the semiconductor chip. Accordingly, the apparatus 1 for aligning a semiconductor chip for packaging may identify the alignment of semiconductor chips even in the nanometer-scale semiconductor packaging process, thereby dramatically increasing the yield by reducing a failure rate due to alignment errors between the semiconductor chips.

According to an embodiment, the plurality of semiconductor chips 200 may include two or more semiconductor chips for being aligned and bonded for packaging. The plurality of semiconductor chips 200 may include various types of semiconductor chips configured in semiconductor packaging.

Each semiconductor chip included in the plurality of semiconductor chips 200 may be, for example, a volatile memory such as dynamic random access memory (DRAM), static random access memory (SRAM), or the like, or a non-volatile memory such as phase-change random access memory (PRAM), magneto-resistive random access memory (MRAM), ferroelectric random access memory (FeRAM), or resistive random access memory (RRAM).

Each of the plurality of semiconductor chips 200 may be a semiconductor device configured with a plurality of individual devices, and the plurality of individual devices may include various microelectronic devices, such as a metal-oxide-semiconductor field effect transistor (MOSFET) such as a complementary metal-insulator-semiconductor transistor (CMOS transistor), or the like, an image sensor such as a system LSI (large scale integration), a CMOS imaging sensor (CIS), or the like, a micro-electro-mechanical system (MEMS), an active device and/or a passive device, or the like.

Each of the plurality of semiconductor chips 200 may include a logic semiconductor chip and/or a memory semiconductor chip. For example, the logic semiconductor chip may include an application processor (AP), micro-processor, central processing unit (CPU), controller, graphic processor unit (GPU), neural processing unit (NPU), high bandwidth memory (HBM), field programmable gate array (FPGA), or application specific integrated circuit (ASIC).

According to an embodiment, the radiation sensor 300 may detect radiation that has penetrated the plurality of semiconductor chips 200. The radiation sensor 300 may include a detector that detects radiation. For example, the radiation sensor 300 may detect radiation by detecting a change in current or voltage caused by the collision of particles (e.g., photons) emitted from the radiation source 100. In an example, the radiation sensor 300 may detect a current resulting from the collision of particles emitted from the radiation source 100, in which case an integral value of the current generated may be proportional to radiation energy incident on the radiation sensor 300.

The radiation sensor 300 may acquire detection information by detecting radiation that has penetrated the plurality of semiconductor chips 200. The detection information may include, for example, a radiation counting rate, radiation energy, and the like.

For example, the radiation sensor 300 may detect radiation in a specific area including an area of the plurality of semiconductor chips 200, in which case the radiation sensor 300 may detect a counting rate of radiation particles incident on each point in the specific area. Here, the area of the plurality of semiconductor chips 200 may include an area of an image created when light is irradiated perpendicular to the plurality of semiconductor chips 200. In this case, the radiation sensor 300 may generate a visualization image based on a counting rate of each point. In an example, the radiation sensor 300 may generate the visualization image using a shading effect, such that an area with a higher counting rate is marked darker because more radiation has been penetrated, and an area with a lower counting rate is marked transparent because less radiation has been penetrated. To this end, the radiation sensor 300 may include an image sensor for visualizing the detection information. A user of the apparatus 1 for aligning a semiconductor chip for packaging may identify whether the plurality of semiconductor chips 200 are aligned by identifying an image visualized by the radiation sensor 300.

According to an embodiment, the radiation source 100 may be an X-ray source, and the radiation sensor 300 may have a resolution in units of nanometers to detect and clearly visualize the radiation irradiated by the radiation source. For example, the radiation sensor 300 may have a resolution of 3 nm or less. In an example, the x-ray has a wavelength of 0.1 to 10 nm, and thus the radiation sensor 300 may have a resolution of 10 nm or less to effectively detect the x-ray. In addition, sensors with different resolutions may be used for the radiation sensor 300 depending on the radiation source 100 being used.

According to an embodiment, the alignment unit 400 may align and bond the plurality of semiconductor chips 200 based on the detection information acquired by the radiation sensor 300. For example, the alignment unit 400 may align the plurality of semiconductor chips 200 to match the shapes of individual semiconductor chips. To this end, the alignment unit 400 may include a moving device (not illustrated) for changing a position of at least one of the plurality of semiconductor chips 200. For example, the moving device may include a robotic arm or nanostage, and the alignment unit 400 may grip a specific semiconductor chip with the robotic arm or move the semiconductor chip using the nanostage.

The alignment unit 400 may be operated to change the positions of the plurality of semiconductor chips 200 manually by a user based on the detection information, or may be operated to change the positions of the plurality of semiconductor chips 200 automatically by a program, software, or the like. In an example, the alignment unit 400 generally aligns the positions of the plurality of semiconductor chips 200 automatically, and it is possible for a user to intervene in a special situation, such as an emergency or breakdown, and manually operate the alignment unit 400 to align the positions of the plurality of semiconductor chips 200.

The apparatus 1 for aligning a semiconductor chip for packaging 200 may include additional configurations such as a silicon interposer, conductive bump, solder ball, connection pad, and insulating adhesive layer for bonding between the plurality of semiconductor chips 200. In addition, the bonding between the plurality of semiconductor chips 200 may be accomplished through various contact methods, such as direct bonding through metal, oxide bonding, and/or direct contact of bonding pads.

Figure 2A:
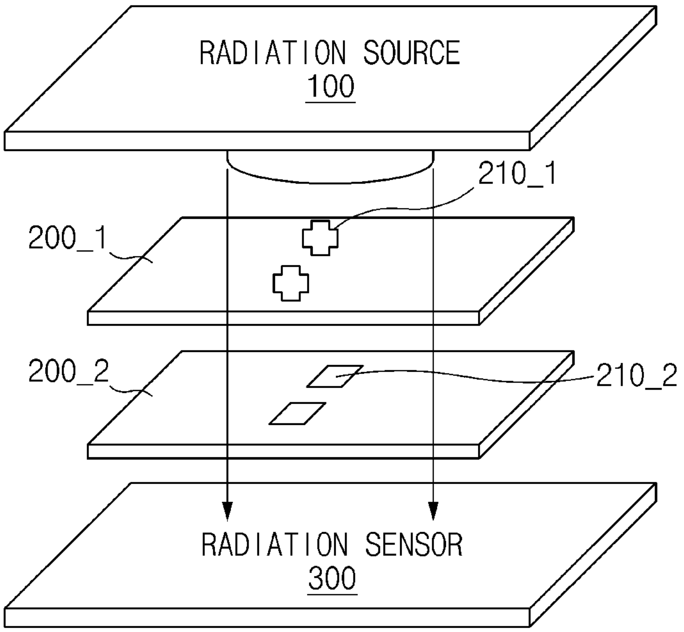
FIGS. 2A and 2B are views illustrating an example of a disposition of the apparatus for aligning a semiconductor chip for packaging, according to an embodiment disclosed in the present document.
Figure 2B:
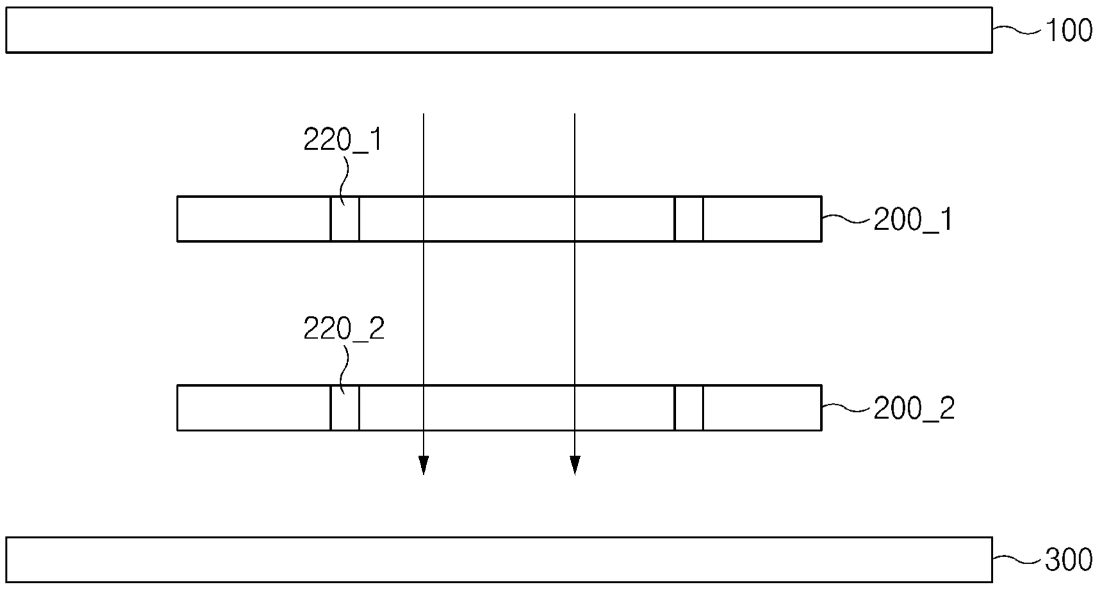

FIGS. 2A and 2B are views illustrating an example of a disposition of the apparatus for aligning a semiconductor chip for packaging, according to an embodiment disclosed in the present document.

Figure 3A:
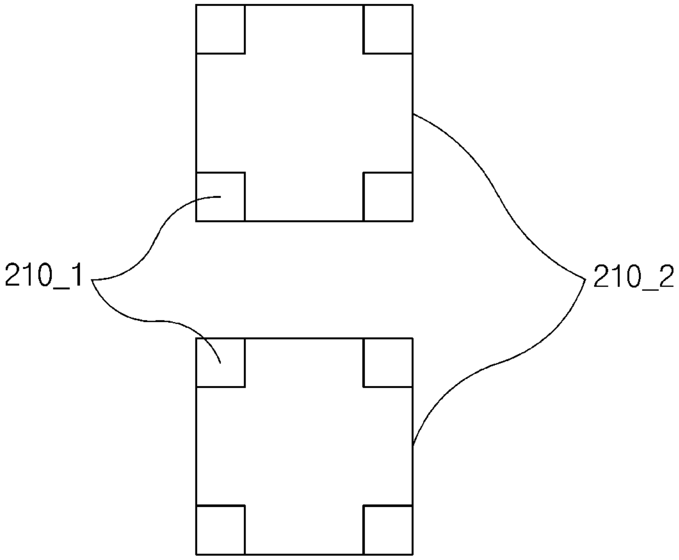
FIG. 3A is a view illustrating an example of matching shapes of alignment marks according to an embodiment disclosed in the present document.
Figure 3B:
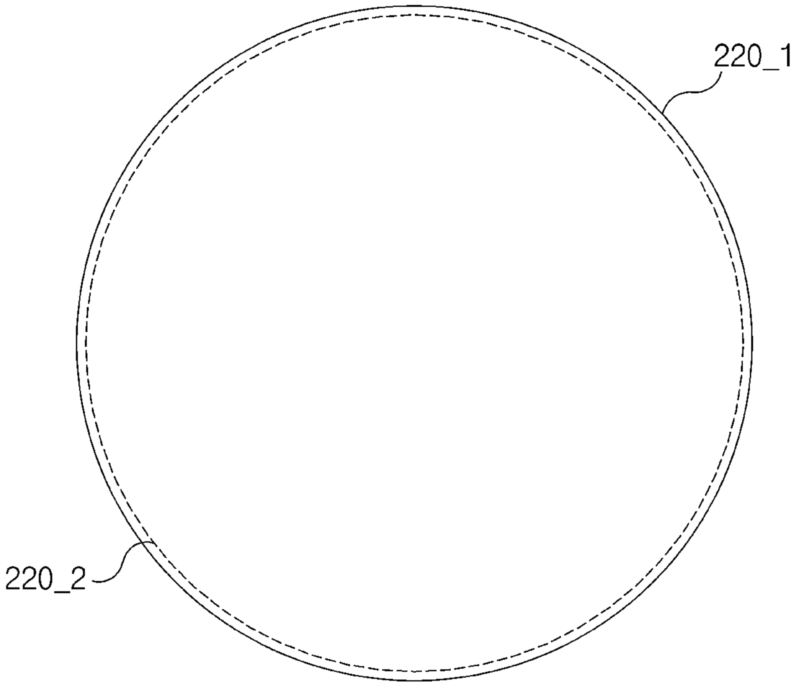
FIG. 3B is a view illustrating an example of matching shapes of TSVs according to an embodiment disclosed in the present document.

FIG. 3A is a view illustrating an example of matching shapes of alignment marks according to an embodiment disclosed in the present document. FIG. 3B is a view illustrating an example of matching shapes of TSVs according to an embodiment disclosed in the present document.

With reference to FIGS. 2A and 2B, the apparatus 1 for aligning a semiconductor chip for packaging may align the plurality of semiconductor chips 200 by vertically disposing the plurality of semiconductor chips.

According to an embodiment, each of the plurality of semiconductor chips 200 may include at least one of an alignment mark, a through silicon via (TSV), or a combination thereof. For example, the plurality of semiconductor chips 200 may all include alignment marks, or may all include TSVs.

The alignment mark may include a mark formed on a specific area of each semiconductor chip to align the plurality of semiconductor chips 200. The TSV may include a through-hole formed for an electrical connection between semiconductor chips when the semiconductor chips are bonded together. The TSV may transmit an electrical signal by connecting to electrodes within the plurality of semiconductor chips 200 through microscopic holes in the plurality of semiconductor chips 200. The alignment mark and TSV may be generated in the processes such as photolithography process, deposition process, etc. prior to the packaging process using the apparatus 1 for aligning a semiconductor chip for packaging.

The alignment mark and TSV may be formed at a specific position on each of the semiconductor chips to align the plurality of semiconductor chips 200. In this case, the apparatus 1 for aligning a semiconductor chip for packaging may form the alignment mark such that matching the positions of the alignment marks (or shapes) may result in the plurality of semiconductor chips 200 being aligned.

Similarly, the apparatus 1 for aligning a semiconductor chip for packaging 1 may form the TSV such that matching the positions of the TSVs (or shapes) may result in the plurality of semiconductor chips 200 being aligned.

According to an embodiment, the detection information of the radiation sensor 300 may include position information on the alignment mark and TSV. In this case, the alignment unit 400 may align the plurality of semiconductor chips 200 based on the position information on the alignment mark and TSV.

According to an embodiment, the alignment unit 400 may align the plurality of semiconductor chips 200 to match the shapes of the alignment marks and/or match the shapes of the TSVs. For example, when the plurality of semiconductor chips 200 include the alignment marks, the alignment unit 400 may align the plurality of semiconductor chips 200 to match the shapes of the alignment marks, and when the plurality of semiconductor chips 200 include the TSVs, the alignment unit 400 may align the plurality of semiconductor chips 200 to match the shapes of the TSVs. In an example, the TSVs may be formed at the same position on each semiconductor chip, in which case the alignment unit 400 may align the plurality of semiconductor chips 200 to match the positions of the TSVs. In another example, the TSVs may not be formed at the same location on each semiconductor chip, and the plurality of semiconductor chips 200 may be positioned and aligned so that one end and the other end of the TSV are connected.

For example, in FIG. 2A, a first semiconductor chip 200_1 may include a first alignment mark 210_1, and a second semiconductor chip 200_2 may include a second alignment mark 210_2. In this case, the first alignment mark 210_1 and the second alignment mark 210_2 may have shapes that are complementary to each other so that whether positions thereof match may be identified. In an example, in FIG. 3A, the first alignment mark 210_1 has the shape of a cross and the second alignment mark 210_2 has the shape of a square, so that the positions of the plurality of semiconductor chips 200_1, 200_2 may be aligned by identifying whether the shape of the first alignment mark 210_1 is in contact with the shape of the second alignment mark 210_2. In FIG. 2A, two semiconductor chips 200_1 and 200_2 are illustrated, but it will be understood that there is no limitation on the number of semiconductor chips, and no limitation on the formation positions and shapes of the alignment marks 210_1 and 210_2.

In addition, with reference to FIG. 2B, the first semiconductor chip 200_1 may include a first TSV 220_1, and the second semiconductor chip 200_2 may include a second TSV 220_2. In this case, the first TSV 220_1 and the second TSV 220_2 may be formed, for example, in the same position to align the first semiconductor chip 200_1 and the second semiconductor chip 220_2 by vertically connecting the first TSV 220_1 and the second TSV 220_2. In an example, in FIG. 3B, the first TSV 220_1 and the second TSV 220_2 may have a cylindrical structure, and the shapes of the first TSV 220_1 and the second TSV 220_2 detected by the radiation sensor 300 may be such that circular shapes overlap. In FIG. 3B, the shapes of the first TSV 220_1 and the second TSV 220_1 are illustrated to be partially spaced apart, but this is for convenience of illustration only and the shapes of the first TSV 220_1 and the second TSV 220_2 may completely overlap. In FIG. 2B, two semiconductor chips 200_1 and 200_2 are illustrated, but it will be understood that there is no limitation on the number of semiconductor chips, and no limitation on the formation positions and shapes of the TSVs 220_1 and 220_2.

According to an embodiment, the alignment mark and TSV may be formed of a material having a lower transmittance of radiation emitted from the radiation source 100 than a predetermined value. In this case, the predetermined value may be set such that when detecting radiation, the radiation sensor 300 may identify a portion of the material with low transmittance. For example, the alignment mark and TSV may be formed of a material with low X-ray transmittance and high absorption, such as nickel, tin, etc. In this case, when the radiation sensor 300 detects radiation that has penetrated the plurality of semiconductor chips 200, no radiation will be detected or less radiation will be detected in a portion corresponding to the position where the alignment mark and TSV are formed. Accordingly, the position information on the alignment mark and TSV of each of the plurality of semiconductor chips 200 may be identified. Therefore, the apparatus 1 for aligning a semiconductor chip for packaging may align the plurality of semiconductor chips 200 by matching the positions of the alignment marks (or shapes) or by matching the positions of the TSVs (or shapes). The apparatus 1 for aligning a semiconductor chip for packaging may use the TSV configured for an electrical connection between chips for alignment without using a separate alignment mark.

According to an embodiment, the plurality of semiconductor chips 200 may be disposed such that each semiconductor chip is vertically disposed with respect to the ground. This may be understood to be for a three-dimensional bonding in semiconductor packaging. In this case, the radiation source 100 may be positioned on an upper side of a semiconductor chip positioned at the uppermost of the plurality of semiconductor chips 200, and the radiation sensor 300 may be positioned on a lower side of a semiconductor chip positioned at the lowermost of the plurality of semiconductor chips 200. By being disposed as described above, the radiation sensor 300 may acquire the detection information by detecting radiation emitted from the radiation source 100 and penetrating the plurality of semiconductor chips 200.

According to an embodiment, the apparatus 1 for aligning a semiconductor chip may further include a camera (not illustrated) that photographs the plurality of semiconductor chips 200. The camera may photograph the alignment mark and TSV included on each of the plurality of semiconductor chips 200. For example, the camera may photograph the plurality of semiconductor chips 200 such that the camera is inserted between the first semiconductor chip and an upper portion of the second semiconductor chip of the plurality of semiconductor chips 200 to photograph a lower portion of the first semiconductor chip and the upper portion of the second semiconductor chip. The camera may include a plurality of lenses to photograph both sides simultaneously.

According to an embodiment, the radiation source 100 may emit radiation to a predetermined area set based on the positions of the alignment mark and TSV acquired from the camera.

In case of the semiconductor chip, semiconductor devices, etc. included in the semiconductor chip may be affected due to the excitation of some electrons in the process of radiation penetration. Since the semiconductor device, etc. are sensitive components that are greatly affected by even the slightest effect, the possibility of damage to the semiconductor chip may not be completely excluded when the radiation source penetrates the semiconductor chip. Therefore, the apparatus 1 for aligning a semiconductor chip for packaging may prevent the semiconductor chip from being damaged by penetrating radiation only to a portion of the area where the alignment mark and/or TSV is positioned, rather than to an entire area of the semiconductor chip. In some cases, the apparatus 1 for aligning a semiconductor chip for packaging may irradiate the entire area of the semiconductor chip with radiation, in which case a low-dose radiation source may be used to minimize damage to the semiconductor chip.

The predetermined area may be set differently for each of the plurality of semiconductor chips 200, and may be set to include the formation positions of the alignment mark and/or TSV included in each of the plurality of semiconductor chips 200. In this case, each alignment mark and/or TSV of the plurality of semiconductor chips 200 may be formed to have the same coordinates in a plane that is perpendicular to a direction from which radiation is irradiated.

According to an embodiment, the apparatus 1 for aligning a semiconductor chip for packaging may optically align the plurality of semiconductor chips 200 based primarily on the positions of the plurality of semiconductor chips 200 that have been photographed by the camera. In this case, optically aligning the plurality of semiconductor chips 200 may also be performed through a process of matching the positions of alignment marks or TSVs included on the plurality of semiconductor chips 200. In addition, the apparatus 1 for aligning a semiconductor chip may set a predetermined area for irradiating the radiation source 100 to perform fine alignment through radiation detection after the optical alignment. Accordingly, the apparatus 1 for aligning a semiconductor chip for packaging may perform fine alignment of the plurality of semiconductor chips 200 based on the detection information of the radiation sensor 300.

According to an embodiment, the apparatus 1 for aligning a semiconductor chip for packaging may include a database or memory that stores position coordinates of the alignment marks and/or TSVs formed on each of the plurality of semiconductor chips 200. The position coordinate of each alignment mark and/or TSV may be stored in the database or memory when the corresponding alignment mark and/or TSV is formed. In this case, the alignment unit 400 may perform alignment of the plurality of semiconductor chips 200 based on the coordinates of the stored alignment marks and/or TSVs. For example, the apparatus 1 for aligning a semiconductor chip for packaging may align the plurality of semiconductor chips 200 based primarily on position coordinates stored in the database or memory and perform fine alignment of the plurality of semiconductor chips 200 using the radiation source 100.

According to an embodiment, the apparatus 1 for aligning a semiconductor chip for packaging may further include a display unit (not illustrated) on which a user may identify the detection information. In this case, the radiation sensor 300 may visualize and provide the detection information for the user to identify, and the user may identify the visualized detection information through the display unit. The user may identify whether the plurality of semiconductor chips 200 are aligned in real time by identifying the detection information and, in some cases, align the plurality of semiconductor chips 200 by directly operating the alignment unit 400.

The apparatus 1 for aligning a semiconductor chip for packaging may perform semiconductor packaging by aligning and bonding the plurality of semiconductor chips 200 as described above. The apparatus 1 for aligning a semiconductor chip for packaging may produce a semiconductor package including the plurality of semiconductor chips 200, and the semiconductor package may be a system in package (SIP) in which the plurality of semiconductor chips 200 of different types are electrically connected to each other and operate as a single system.

Figure 4:
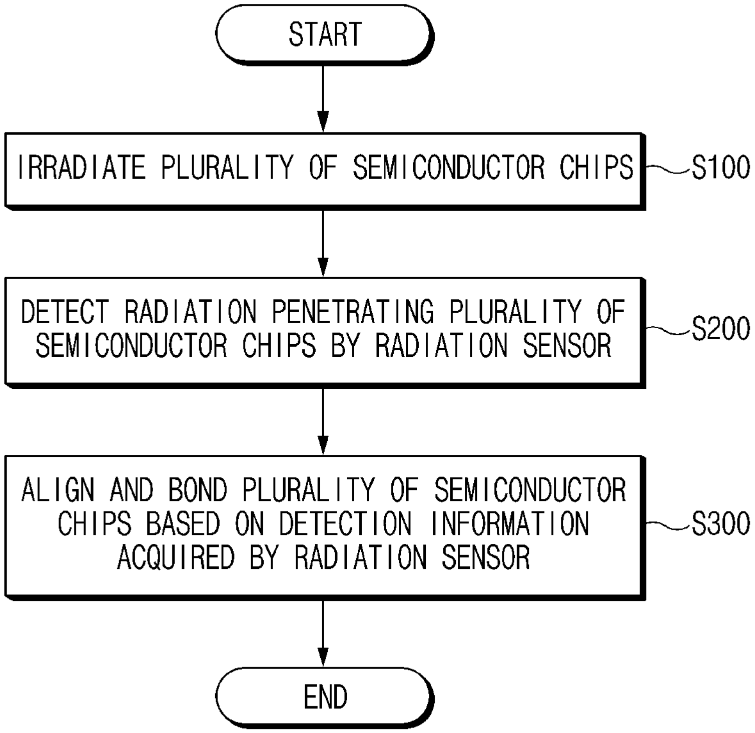
FIG. 4 is a flowchart for describing a method of aligning a semiconductor chip for packaging, according to an embodiment disclosed in the present document.

FIG. 4 is a flowchart for describing a method of aligning a semiconductor chip for packaging, according to an embodiment disclosed in the present document.

With reference to FIG. 4, a method of aligning a semiconductor chip may include irradiating a plurality of semiconductor chips with radiation (S100), detecting, by a radiation sensor, radiation that has penetrated the plurality of semiconductor chips (S200), and aligning and bonding the plurality of semiconductor chips based on detection information acquired by the radiation sensor (S300).

In step S100, the radiation source 100 may irradiate the plurality of semiconductor chips 200 with radiation.

In step S200, the radiation sensor 300 may detect radiation that has penetrated the plurality of semiconductor chips 200.

In step S300, the alignment unit 400 may align and bond the plurality of semiconductor chips 200 based on the detection information acquired by the radiation sensor 300. In this case, the detection information may include position information on the alignment marks and/or TSVs included in the plurality of semiconductor chips 200.

All the constituent elements, which constitute the embodiment disclosed in the present disclosure described above, may be integrally coupled or operate by being combined, but the embodiments disclosed in the present disclosure are not necessarily limited to the embodiment. That is, one or more of the constituent elements may be selectively combined and operated within the object of the embodiments disclosed in the present disclosure.

In addition, unless explicitly described to the contrary, the words “comprise,” “include,” or “have” and variations such as “comprises,” “comprising,” “includes,” “including,” has,” or “having,” imply the inclusion of stated elements, and thus should be understood to imply the further inclusion of any other elements but not the exclusion thereof. Unless otherwise defined, all terms including technical or scientific terms may have the same meaning as commonly understood by those skilled in the art to which the embodiments disclosed in the present disclosure pertain. The terms such as those defined in a commonly used dictionary may be interpreted as having meanings consistent with meanings in the context of related technologies and may not be interpreted as ideal or excessively formal meanings unless explicitly defined in the present disclosure.

The above description is simply given for illustratively describing the technical spirit disclosed in the present embodiment, and those skilled in the art to which the embodiments disclosed in the present disclosure pertain will appreciate that various changes and modifications are possible without departing from the essential characteristics of the embodiments disclosed in the present disclosure. Therefore, the embodiments disclosed in the present disclosure are provided for illustrative purposes only but not intended to limit the technical concept of the embodiments disclosed in the present disclosure. The scope of the technical spirit disclosed in the present disclosure is not limited by the embodiment. The protective scope of the technical spirit disclosed in the present disclosure should be construed based on the appended claims, and all the technical spirit in the equivalent scope thereto should be construed as falling within the scope of the present disclosure.

DESCRIPTION OF REFERENCE NUMERALS

100: Radiation source
200: Plurality of semiconductor chips

200_1: First semiconductor chip
200_2: Second semiconductor chip
210_1: First alignment mark
210_2: Second alignment mark
220_1: First TSV
220_2: Second TSV
300: Radiation sensor
400: Alignment unit

What is claimed is:

1. An apparatus for aligning a semiconductor chip for packaging, the apparatus comprising:

a radiation source configured to irradiate a plurality of semiconductor chips with radiation;

a radiation sensor configured to detect the radiation that has penetrated the plurality of semiconductor chips;

an alignment unit configured to align and bond the plurality of semiconductor chips based on detection information acquired by the radiation sensor; and a camera configured to photograph the plurality of semiconductor chips, wherein each of the plurality of semiconductor chips comprises at least one of an alignment mark, a through silicon via (TSV), or a combination thereof, and wherein the radiation source irradiates the radiation to a predetermined area set based on positions of the alignment mark and the TSV acquired from the camera.

2. The apparatus of claim 1, wherein the detection information comprises position information on the alignment mark and the TSV, and wherein the alignment unit aligns the plurality of semiconductor chips based on the position information.

3. The apparatus of claim 2, wherein the alignment unit aligns the plurality of semiconductor chips such that shapes of the alignment marks and/or shapes of the TSVs are matched based on the position information.

4. The apparatus of claim 1, wherein the alignment mark and the TSV are formed of a material having a lower radiation transmittance than a radiation transmittance of the plurality of semiconductor chips.

5. The apparatus of claim 1, wherein the plurality of semiconductor chips are vertically disposed with respect to the ground, wherein the radiation source is positioned on an upper side of a semiconductor chip positioned at the uppermost of the plurality of semiconductor chips, and wherein the radiation sensor is positioned on a lower side of a semiconductor chip positioned at the lowermost of the plurality of semiconductor chips.

6. The apparatus of claim 1, further comprising:

a display unit configured for a user to identify the detection information; and an operation unit configured to operate the alignment unit.

7. The apparatus of claim 1, wherein the radiation source is an X-ray source.

8. The apparatus of claim 1, wherein the radiation sensor has a resolution in units of nanometers.

* * * * *